United States Patent [19]
Anger et al.

[11] 4,335,309
[45] Jun. 15, 1982

[54] METHOD AND DEVICE FOR THE RAPID DEFLECTION OF A PARTICLE BEAM

[75] Inventors: Klaus Anger; Jüergen Frosien, both of Berlin, Fed. Rep. of Germany

[73] Assignee: Siemens Aktiengesellschaft, Berlin & Munich, Fed. Rep. of Germany

[21] Appl. No.: 172,085

[22] Filed: Jul. 24, 1980

[30] Foreign Application Priority Data

Sep. 13, 1979 [DE] Fed. Rep. of Germany ....... 2937136

[51] Int. Cl.³ ..................... H01J 37/00; H01J 36/147
[52] U.S. Cl. ................................. 250/396 R; 250/398
[58] Field of Search ........... 250/396 R, 396 ML, 398, 250/492 A; 219/121 EB, 121 ED; 313/359, 361

[56] References Cited

U.S. PATENT DOCUMENTS

| | | | |
|---|---|---|---|
| 3,749,964 | 7/1973 | Hirata | 250/398 |
| 3,894,271 | 7/1975 | Pfeiffer et al. | 250/492 A |
| 4,117,339 | 9/1978 | Wolfe | 250/398 |
| 4,149,085 | 4/1979 | Davis et al. | 250/398 |
| 4,213,053 | 7/1980 | Pfeiffer | 250/398 |

OTHER PUBLICATIONS

J. L. Maner et al., "Electronoptics of the Electron–beam Lithography System, EL1 " *Tech. Digest*, 1976, International Electron Devices Meeting, Washington, D.C., pp. 434–436.

J. L. Loughram et al., "Correction of Field Distortion in the Electron–beam Lithography System, EL1, " *Tech. Dig.*, 1976, International Electron Devices Meeting, Washington, D.C., pp. 437–439.

D. E. Davis et al., "Automatic Registration in an Electron–beam Exposure System", *Tech. Dig.*, 1976, Int. Electron Devices Meeting, Wash., D.C., pp. 440–442.

*Primary Examiner*—Bruce C. Anderson
*Attorney, Agent, or Firm*—Hill, Van Santen, Steadman, Chiara & Simpson

[57] ABSTRACT

In an exemplary system, a two stage deflection system responds to a first control signal of low frequency such that extra-axial chromatic errors due to electrostatic and magnetic deflection are made equal and opposite. The magnetic and electrostatic deflection systems may be arranged in either order along the beam path just so the low frequency electrostatic deflection is one-half the magnetic deflection and is in an opposite direction at the target. A second higher frequency control signal controls only the electrostatic deflection system. Preferably the deflection velocities at the target produced by the two control signals are equal, with the higher frequency being an integral multiple of the lower frequency and with the control signals being poled to provide opposite deflections. When the two deflection velocities are superimposed, the resultant is then a step type deflection as a function of time.

4 Claims, 7 Drawing Figures

$Wr = Wm + We_1 + We_2$

METHOD AND DEVICE FOR THE RAPID DEFLECTION OF A PARTICLE BEAM

BACKGROUND OF THE INVENTION

The invention relates to a method for the rapid deflection of a particle beam in a particle radiation optical device, particularly an electron beam writer, wherein an electrostatic and a magnetic deflection means are crossed (orthogonally disposed relative to one another) for producing deflection in a given plane and are arranged lying behind one another in the beam direction. The invention further relates to a device for implementing this method.

Lithographic generation of fine structures presently ensues in devices in which a fine or, on the other hand, already shaped particle beam—particularly an electron beam—is guided over a target to be structured. A very rapid deflection of the writing beam with frequencies up to 100 MHz is indispensible for the economical employment of such methods. In known, purely magnetic single or two-stage deflection systems, there is the problem at such high deflection speeds of constructing correspondingly rapid deflection amplifiers which are in a position to change the deflection currents with the required speed.

Although purely electrostatic deflection systems function quickly, they exhibit greater deflection errors—particularly chromatic errors—and are therefore unsuitable for generating structure over large image fields.

A combined, two-stage deflection system with an electrostatic deflection means and a magnetic deflection device lying behind it in the beam direction has already become known. In this system, a slow deflection of great amplitude is undertaken with the assistance of the magnetic deflection means and a rapid deflection of small amplitude is undertaken with the assistance of the electrostatic deflection means. To that end, the two deflection devices are driven with different signals. Therefore, there is no possibility for eliminating the extra-axial chromatic errors in addition to the geometrical errors. The chromatic errors are somewhat reduced by means of superimposing this deflection system with a projection lens (J. L. Mauer, H. C. Pfeiffer, W. Stickel, "International electron devices meeting", December 1976, Washington, pages 434–436) but, however, they are not completely eliminated.

SUMMARY OF THE INVENTION

The object of the present invention is therefore to specify a method and a corresponding device in which the extra-axial chromatic errors are compensated to the greatest degree by means of said method and device alone and without additional means.

This object is inventively achieved given a method of the type initially cited by the features cited in the characterizing part of claim 1. The inventive method is based on the idea that the extra-axial chromatic errors are different in size for the magnetic and for the electrostatic deflection. For a magnetic deflection, $$\Delta w_m = -\tfrac{1}{2} \cdot \Delta U/U \cdot w_m$$

derives for the extra-axial chromatic error at the axis interval w of the particle beam in the image plane. On the other hand, $$\Delta w_e = \Delta U/U \cdot w_e$$

derives for an electrostatic deflection. Thereby, $w_m$ or, respectively, $w_e$ means the intervals from the axis for the corresponding deflections in the image plane; $\Delta U/U$ is a measure for the energy band width of the particle beam. As one can see from these equations, the extra-axial chromatic errors for the magnetic and electrostatic deflection have differing operational signs. Moreover, the error for the magnetic deflection is half as great as that for the electrostatic. An anchromatic deflection can therefore be achieved when the two chromatic errors are of equal size in terms of amount. That is achieved when the magnetic deflection is twice as great and proceeds antiparallel (oppositely) to the electrostatic deflection, i.e., when $w_m = -2w_e$.

Therefore, in contrast to the known combined deflection system, the magnetic and the electrostatic deflection means are inventively driven with the same frequency. By so doing, a slow deflection is first rendered possible over a great range. Corresponding deflection amplifiers for the current supply of the magnetic deflection means can be simply realized. The electrostatic deflection means is additionally driven alone for rapid, small deflections. Since, thereby, it is here only a matter of relatively small deflection amplitudes, the correction of the extra-axial chromatic errors is largely retained.

In the manufacture of high-integrated circuits (large scale integrated circuits), the semiconductor wafers are coated with an electron-sensitive lacquer and are subsequently exposed in an electron beam writer. Depending on the type of lacquer employed, a specific dwell time of the electron beam probe is required at a location for a sufficient exposure. After this time, the probe is quickly moved to the neighboring region in order to expose this as well. The deflection curve for such an operation corresponds to a stepped curve, whereby the width of the individual step stages corresponds to the dwell time and the height of the individual step stages is the distance of the jump. In order to realize such a curve, it is provided in a further development of the inventive method that the deflection velocity resulting from the drive with the frequency $f_1$ is oppositely identical to the deflection velocity effected by means of the additional electrostatic deflection with the frequency $f_2$.

An advantageous device for implementing the inventive method derives, given a deflection system in which the magnetic deflection means consists of magnetic coils and the electrostatic deflection means consists of capacitors, from the characterizing features of claim 3.

In order to reduce the geometrical deflection errors in addition to that extra-axial chromatic errors, the two deflection devices are relatively rotated somewhat out of the crossed position.

In the following, two exemplary embodiments of the invention are described and explained in greater detail on the basis of seven Figures shown on the accompanying drawing sheets; and other objects, features and advantages will be apparent from this detailed disclosure and from the appended claims.

DETAILED DESCRIPTION

Figure 1:
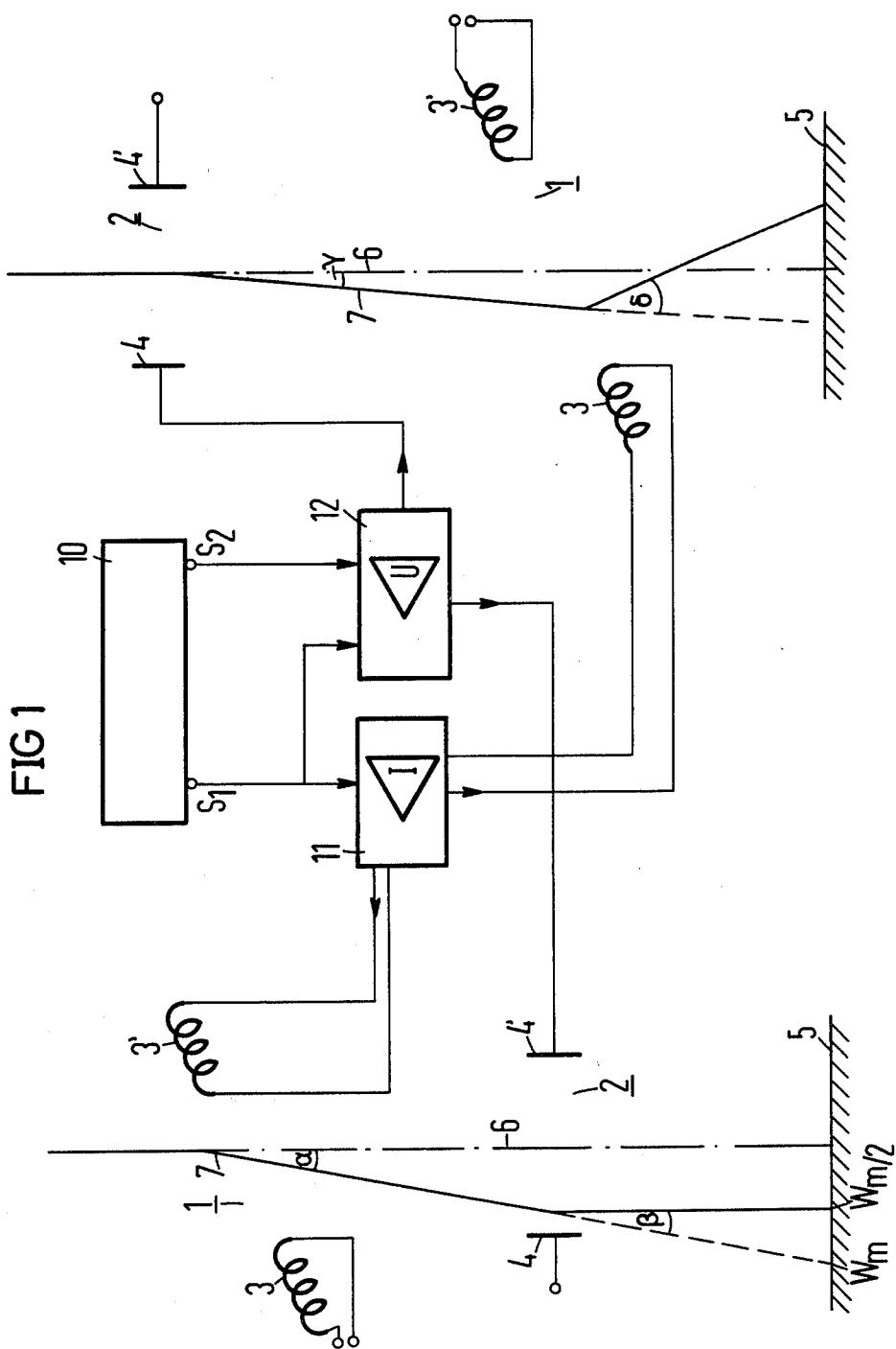
FIG. 1 in a basic diagram shows two possible embodiments of a device for the inventive rapid and chromatic-error-free deflection.

A combined, crossed deflection system with a magnetic deflection means 1 and an electrostatic deflection means 2 is illustrated in perspective view in the left-hand part of FIG. 1. The magnetic deflection system consists of two magnetic coils 3, 3'. The electrostatic deflection system consists of the capacitor plates 4, 4'. A target 5 to be exposed is situated beyond this deflection system. The electron beam writer (not illustrated in greater detail here) has an axis 6. The fields of the two deflection devices 1 and 2 are generally perpendicular to one another so as to produce deflection in a given plane (such as the plane of FIG. 1).

Referring to the deflection system at the left in FIG. 1 when the electron beam 7 passes through the magnetic deflection system 1, it is deflected by a specific angle α from the axis 6. Without the electrostatic deflection system 2 following in the beam direction, the beam deflected in such manner would strike the target 5 at an interval $w_m$, as is indicated by means of the broken line. Due to the electrostatic deflection system 2, however, the electron beam 7 is again deflected back toward the axis by an angle β so that the electron beam 7 strikes the target 5 at an interval from the axis $w_m/2$.

Illustrated in the right-hand part of FIG. 1 is an exemplary embodiment in which the position of the two deflection means is interchanged in the beam direction, i.e., the electrostatic deflection system 2 comes first in the beam direction and, subsequently the magnetic deflection system 1. By so doing, the electron beam is first deflected by the angle γ in one direction and is subsequently deflected by the angle δ in the opposite direction. Thereby, the principle is not changed at all. Identical parts are provided with the same reference symbols.

The common drive for both beam writing stations is schematically illustrated in the center of FIG. 1. A function generator 10 supplies a slow control signal $S_1$ with the frequency $f_1$. This signal simultaneously drives a current amplifier 11 and a voltage amplifier 12. The deflection current through the magnetic coils 3, 3' is changed via the current amplifier 11 in accord with the control function $S_1$. In the same manner and synchronous thereto, the voltage at the capacitor plates 4, 4' is changed via the voltage amplifier 12. The slow, chromatic-error-free deflection of the electron beam, as illustrated in the left and right-hand halves of FIG. 1, is assured by means of this drive.

Further, the function generator 10 supplies an output signal $S_2$ with the higher frequency $f_2$. This signal additionally drives only the voltage amplifier 12, whereby a deflection voltage changing with high frequency is superimposed on the slowly changing deflection voltage adjacent to the capacitor plates 4, 4'.

Figure 2:
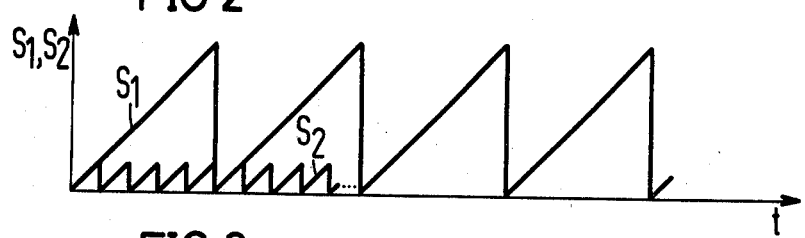
FIGS. 2 through 7 show a possible time-dependent drive of the deflection means and the deflection curves resulting therefrom.

The control signals $S_1$ and $S_2$ of the function generator 10 are indicated over the time t in FIG. 2 by way of example. In this example, the two control signals differ as to frequency only by a factor of five. In practice, the difference of frequency will be significantly higher. The difference in the amplitudes of the control signals will be likewise much greater than that shown in FIG. 2.

Figure 3:
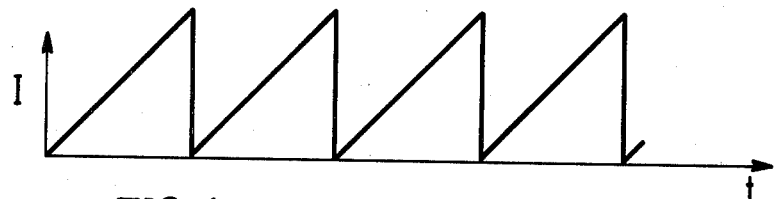
Figure 4:
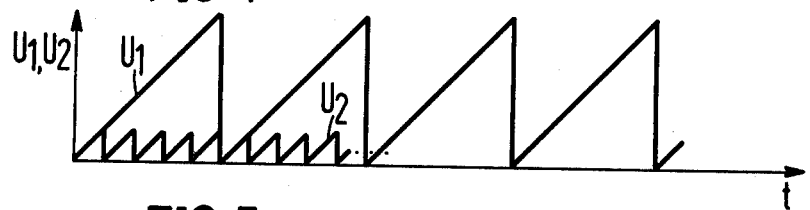
Figure 5:
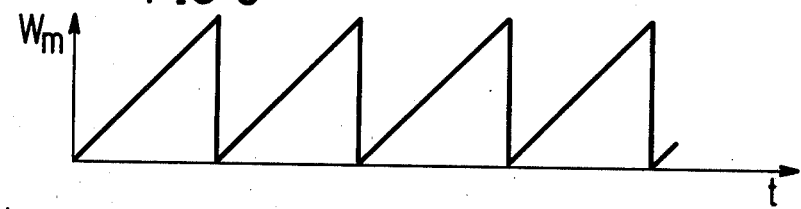
Figure 6:
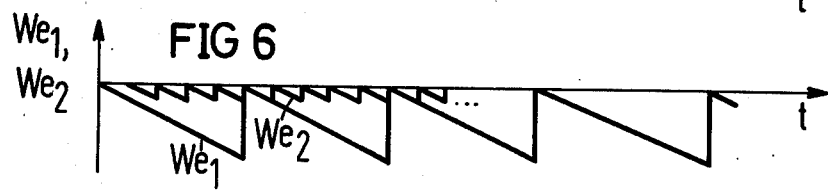
Figure 7:
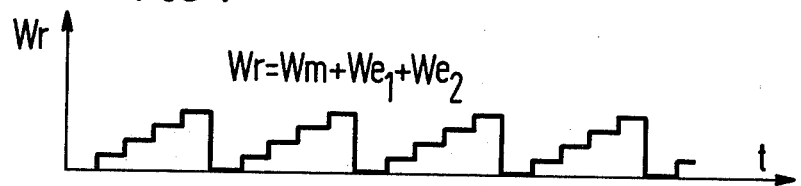

The deflection current I is indicated in FIG. 3 in the same time scale as in FIG. 2. The deflection voltage $U_1$ and $U_2$ resulting from the control signal $S_1$ and $S_2$ are correspondingly indicated in FIG. 4. FIGS. 5 and 6, again in the same time scale, illustrate the magnetically conditioned as well as the electrostatically conditioned deflection $w_m$ and $w_{e1}$, $w_{e2}$ corresponding to deflection voltages $U_1$ and $U_2$. The final FIG. 7 shows the resultant deflection $w_r$ on the target deriving from the magnetic and the electrostatic deflection. By changing the frequencies and the amplitudes of the control signals $S_1$ and $S_2$, the stepped curve and, thus, the jump distance of the probe and the exposure time can be easily varied.

A further possibility for the drive and for the deflection of the electron beam would, for example, be that the slow deflection proceeds in large stepped stages on which the rapid deflection with small stepped stages is superimposed, so that the resultant deflection again represents a stepped curve in accord with FIG. 7.

The deflection of an electron beam was described in the exemplary embodiments. It is possible to deflect an ion beam in the same manner, with which ion beam, for example, in an ion beam device, the lacquer on the target can be etched away in the exposed areas.

The exemplary embodiments show the deflection in one coordinate. For the coordinate perpendicular thereto, further deflection systems turned by 90° must be provided.

It will be apparent that many modifications and variations may be effected without departing from the scope of the novel concepts and teachings of the present invention.

We claim as our invention:

1. A method for deflecting a particle beam in a particle radiation optical device, particularly an electron beam writer, wherein for producing the deflection, an electrostatic and a magnetic deflection means are generally in crossed relationship to one another and are arranged one behind the other in the beam direction, characterized in that for the purpose of compensation of extra-axial chromatic errors to a maximum degree: both deflection means (1, 2) are simultaneously driven with a first frequency ($f_1$) in such manner that the electrostatic deflection of the particle beam (7) is antiparallel and half as great as the magnetic deflection; and in that the electrostatic deflection means (2) is additionally driven with a second higher frequency ($f_2$; $f_2 > f_1$) whose amplitude is such as to produce a smaller deflection amplitude than the amplitude of the electrostatic deflection produced by the first frequency ($f_1$).

2. A method for deflecting a particle beam according to claim 1, characterized in that the deflection velocity resulting from the drive with the first frequency ($f_1$) is oppositely equal to the deflection velocity effected with the additional electrostatic deflection with the second higher frequency ($f_2$) so as to produce a deflection of the particle beam corresponding to a stepped pattern.

3. A particle radiation optical device, particularly an electron beam writer, having a deflectable particle beam, said device comprising an electrostatic and a magnetic deflection means which are generally in crossed relationship to one another and are arranged one behind the other in the beam direction, said magnetic deflection means comprising deflection coils for producing a magnetic deflection field, said electrostatic deflection means comprising capacitor plates for producing an electrostatic deflection field, characterized in that for the purpose of compensation of extra-axial chromatic errors to a maximum degree:

a current amplifier (11) connected with the deflection coils and a voltage amplifier (12) connected with the capacitor plates are simultaneously driven with a first frequency ($f_1$) in such manner that the electrostatic deflection of the particle beam is antiparallel and half as great as the magnetic deflection; and in that the voltage amplifier (12) is also driven with a second higher frequency ($f_2$; $f_2 > f_1$) whose amplitude is such as to produce a smaller deflection amplitude than the amplitude of the electrostatic deflection produced by the first frequency; a control element (10) having an output for supplying said first frequency in common to both said amplifiers (11, 12) and having a further output for supplying said second higher frequency to said voltage amplifier (12).

4. A device according to claim 3, characterized in that the two deflection means (1,2) are rotated somewhat out of the crossed position so as to reduce geometrical deflection errors.

* * * * *